US007102397B2

(12) United States Patent
Sweet

(10) Patent No.: US 7,102,397 B2
(45) Date of Patent: Sep. 5, 2006

(54) METHOD AND SYSTEM FOR ENSURING THE ASSERTION ORDER OF SIGNALS IN A CHIP INDEPENDENT OF PHYSICAL LAYOUT

(75) Inventor: James D. Sweet, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 138 days.

(21) Appl. No.: 10/961,015

(22) Filed: Oct. 8, 2004

(65) Prior Publication Data

US 2006/0049861 A1 Mar. 9, 2006

Related U.S. Application Data

(60) Provisional application No. 60/607,646, filed on Sep. 7, 2004.

(51) Int. Cl.
*H03L 7/00* (2006.01)

(52) U.S. Cl. ....................................................... 327/143
(58) Field of Classification Search ................ 327/142, 327/143, 198
See application file for complete search history.

(56) References Cited

U.S. PATENT DOCUMENTS

| 6,085,342 A * | 7/2000 | Marholev et al. ............ 714/724 |
| 6,188,256 B1 * | 2/2001 | Birns et al. .................. 327/142 |
| 6,744,291 B1 * | 6/2004 | Payne et al. ................. 327/143 |
| 2003/0038665 A1 * | 2/2003 | Naven ........................ 327/298 |

* cited by examiner

*Primary Examiner*—Jeffrey Zweizig
(74) *Attorney, Agent, or Firm*—McAndrews, Held & Malloy, Ltd.

(57) ABSTRACT

Certain embodiments for ensuring the assertion order of signals in a chip independent of physical layout may comprise receiving a first signal by a first logic block of a plurality of logic blocks integrated within a chip, where the first signal may initiate a reset of a first function within the first logic block. A second signal may be communicated from within the first logic block to a second function within a second logic block of the plurality of logic blocks, and the second signal may be adapted to initiate the second function. The first signal may be the same as a second signal. The reset of the first function may initialize the first function to a known state before the second function may generate an output that may be received by the first function. The first function may place the chip in a test mode when indicated by the generated output of the second function.

18 Claims, 5 Drawing Sheets

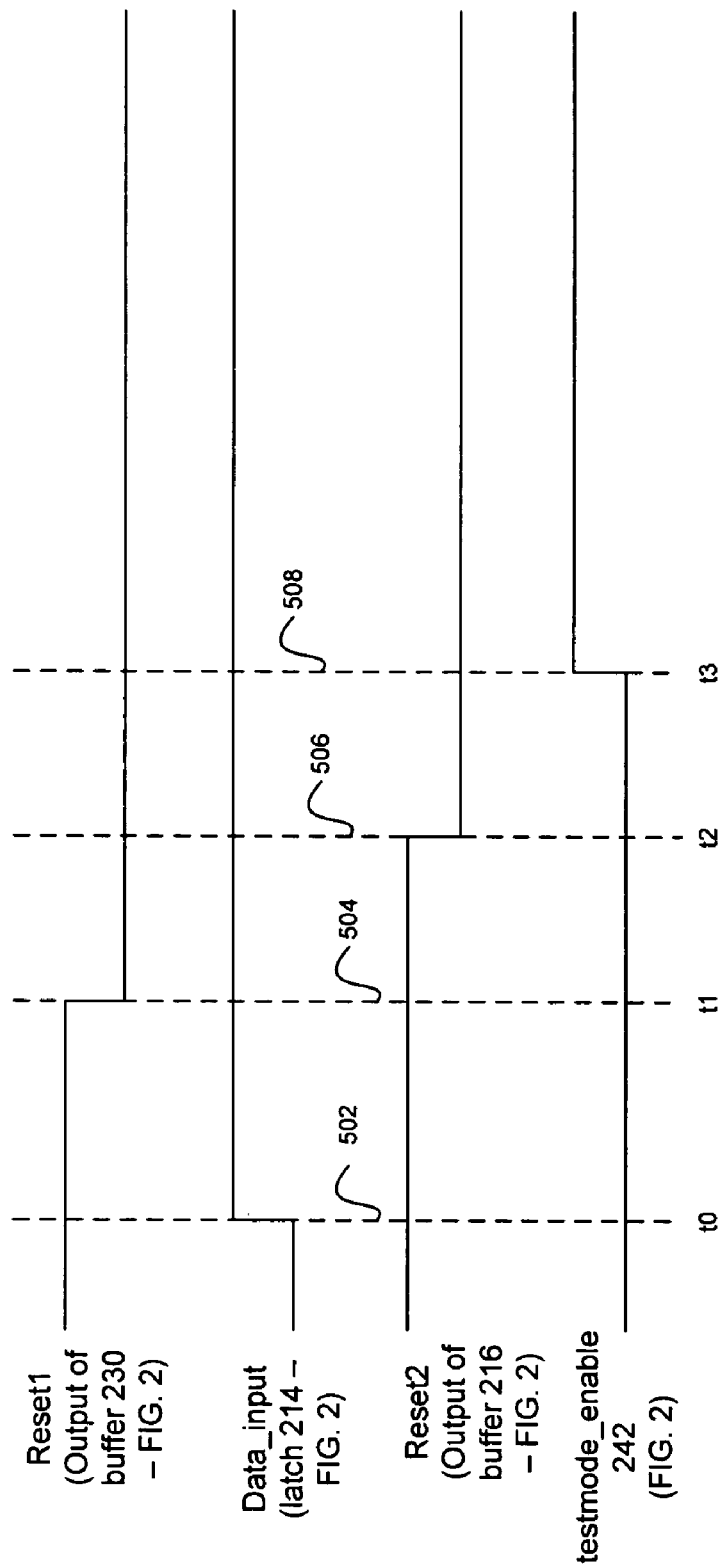

METHOD AND SYSTEM FOR ENSURING THE ASSERTION ORDER OF SIGNALS IN A CHIP INDEPENDENT OF PHYSICAL LAYOUT

CROSS-REFERENCE TO RELATED APPLICATIONS/INCORPORATION BY REFERENCE

This application makes reference, claims priority to, and claims the benefit of U.S. Provisional Application Ser. No. 60/607,646 filed Sep. 7, 2004.

The above stated application is hereby incorporated herein by reference in its entirety.

FIELD OF THE INVENTION

Certain embodiments of the invention relate to operation of signals in an integrated circuit chip. More specifically, certain embodiments of the invention relate to a method and system for ensuring the assertion order of signals in a chip independent of physical layout.

BACKGROUND OF THE INVENTION

In some conventional integrated circuits (ICs), the ICs are designed as a collection of functional blocks that are physically arranged on a die for fabrication. When an IC is complex and relatively large, blocks frequently end up being placed far enough apart that differences in the propagation delay of signals to the blocks, and between the blocks, may affect the behavior of the IC in undesirable ways.

In instances where the signal may be coupled to multiple blocks that are not placed in close physical proximity on the IC die, there may be significant differences in the propagation delay as signals propagate from a source to one or more destination blocks. In this regard, the signal's arrival time at each of the destination blocks may be different based on the physical arrangement of the blocks on the die. In operation, it may be critical that one of the blocks receives the input signal before another block, independent of the manner in which the blocks are physically arranged.

Furthermore, it may also be critical that one block does not receive the input signal unless another block also receives it. If the input signal takes completely different paths to each block, the paths may have different buffering logic that may react differently to signal glitches. Therefore, it may be possible for a glitch to reach one block and not the other. Depending on the system requirements, this may have catastrophic effects, such as, for example, invalid data being latched resulting in calculation of a completely useless output, or a state machine transitioning to a different state than it should and therefore being "out of sync" with other blocks and performing unexpected and undesired functions.

FIG. 1 is a block diagram of a conventional system that illustrates problems associated with signal propagation in an integrated circuit. Referring to FIG. 1, there is shown a general logic block (GLB) 102, a reset processing block (RPB) 104, and a special logic block (SLB) 106.

The GLB 102 may comprise decode testmode module (DTM) 110, general decode module (GDM) 112, a latch 114 and a buffer 116. The DTM 110 comprises suitable logic, circuitry and/or code that may be adapted to decode input signals such that the DTM 110 may generate a test mode signal that may indicate to the chip that a test of the chip may take place. The latch 114 may temporarily hold the signal generated by the DTM 110. The GDM 112 comprises suitable logic, circuitry and/or code that may be adapted to the chip to function in a normal mode. The RPB 104 may comprise input processing module (IPM) 120 and a buffer 122. The IPM 120 comprises suitable logic, circuitry and/or code to process an input reset signal for use inside the chip. The SLB 106 may comprise a buffer 130 and special logic module (SLM) 132. The SLM 132 comprises suitable logic, circuitry and/or code so that the SLM 132 may configure the chip for a chip test mode. The buffers 116, 122 and 130 may be used to add delay to a signal path, to buffer a signal to isolate a signal, and/or to increase the strength of the signal.

The RPB 104 may be adapted to receive and process an input reset signal 150. For example, RPB 104 may be adapted to synchronize the received input reset signal 150 to a system clock in order to generate the processed reset signal 152 for distribution to other blocks. The GLB 102, which may generally be the logic for the specific functionality of the chip in the normal operating mode, may receive a processed reset signal 152 from RPB 104 and may utilize the processed reset signal 152 to initialize or configure circuitry in the GLB 104 to a known state. The SLB 106 may be utilized for internally testing the chip, and may also receive the processed reset signal 152.

A chip design may include a signal that is used in multiple blocks. For example, in FIG. 1, the GLB 102 and the SLB 106 may utilize the processed reset signal 152. The processed reset signal 152 may be communicated to SLB 106 where it may be buffered by buffer 130 to generate a first reset signal 154 that may then be used to reset SLM 132. The processed reset signal 152 may also be communicated to the GLB 102 where it may be buffered by the buffer 116 to generate a second reset signal 156 that may be used to enable latch 114. The input to the latch 114 may be a signal indicating that the chip, comprising the GLB 102, the RPB 104, and the SLB 106, may be tested. An output signal testmode_enable 142 from the latch 114 may be a signal that may be utilized by the SLM 132 to select the chip for test mode. Therefore, there may be a requirement that the different blocks receive the first and second reset signals 154 and 156 in a specific order to function properly.

If, for example, the SLM 132 must be reset before the output of the latch 114 changes, the exemplary system of FIG. 1 may not function as desired. In this example, if a propagation delay for the processed reset signal 152 is longer from the RPB 104 to the SLB 106 than a propagation delay from the RPB 104 to the GLB 102, then the second reset signal 156 may enable the latch 114 before the first reset signal 154 may reset the SLM 132, and the output signal testmode_enable 142 from latch 114 may change before the SLM 132 may be reset. A result may be that the SLM 132 may not be reset before the rising edge of testmode_enable 142 which may cause improper operation. As another example, a glitch may occur on the reset signal 152. Due to differences in the characteristics of buffers 130 and 116, the latch 114 may see the reset, and the SLM 132 may not. This would result in the testmode_enable signal 142 being asserted without the SLM 132 getting reset at all.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for ensuring the assertion order of signals in a chip independent of physical layout. Aspects of the method may comprise receiving a first signal by a first logic block of a plurality of logic blocks integrated within a chip, where the first signal may initiate a reset of a first function in the first logic block. A second signal may be communicated from within the first logic block to a second function of a second logic block of the plurality of logic blocks, and the second signal may be adapted to initiate the second function. The first signal may be the same as the second signal.

The reset of the first function may initialize the first function to a known state before the second function may generate an output that may be received by the first function. The first function may place the chip in a test mode when indicated by the generated output of the second function.

The second signal may be communicated to an input of a latching device, and the second signal may be adapted to latch a data input to the latching device. The first signal may be communicated to at least a portion of the plurality of logic blocks in a daisy-chained manner. The first signal may also be communicated to at least one output of the chip, where the first signal may be utilized by at least one off-chip device.

Circuitry, such as a buffer or other logic, may be adapted to buffer at least a portion of the first signal within the first logic block, and/or buffer at least a portion of the second signal within the second logic block. The first signal also may be received at the first logic block utilizing synchronous logic, and/or the second signal may be received at the second logic block utilizing synchronous logic.

Aspects of the system may comprise a first function within a first logic block of a plurality of logic blocks and a second function within a second logic block of a plurality of logic blocks, where the logic blocks may be integrated within a chip. The first function within the first logic block may receive a first signal that initiates a reset of the first function within the first logic block. A second signal may be communicated from the first logic block to the second function within the second logic block. The second signal may be the same as the first signal.

The second signal may be utilized to initiate the second function to generate an output to be communicated to the first function. The first signal may be utilized to reset the first function to initialize the first function to a known state prior to the second function generating an output that may be received by the first function. The first function may initiate a test mode for the chip when indicated by the generated output of the second function.

The second signal may be communicated to an input of the latching device in the second logic block where the second signal may be utilized to latch a data input to the latching device. The first signal may be communicated to at least a portion of the plurality of logic blocks in a daisy-chained manner. The first signal may also be communicated via at least one output on the chip to at least one off-chip device. At least a portion of the first signal may be buffered by circuitry within the first logic block, and/or at least a portion of the second signal may be buffered by circuitry within the second logic block. Synchronous logic may receive the first signal at the first logic block, and/or synchronous logic may receive the second signal at the second logic block.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 5 is a timing diagram illustrating exemplary timing of signals that may be utilized for ensuring the assertion order of signals in a chip independent of physical layout.

DETAILED DESCRIPTION OF THE INVENTION

Certain embodiments of the invention may be found in a method and system for ensuring the assertion order of signals in a chip independent of physical layout. Various aspects of the invention provide support for proper assertion of signals in a chip. Aspects of the invention may comprise receiving a first signal by a first logic block of a plurality of logic blocks integrated within a chip, where the first signal may initiate a reset of a first function in the first logic block. A second signal may be communicated from within the first logic block to a second function of a second logic block of the plurality of logic blocks, and the second signal may be adapted to initiate the second function. The first signal may be the same as the second signal. The reset of the first function may initialize the first function to a known state before the second function may generate an output that may be received by the first function. The first function may place the chip in a test mode when indicated by the generated output of the second function. The chip may be an integrated circuit, a system on a chip (SOC), or other similar type of device.

Figure 2:
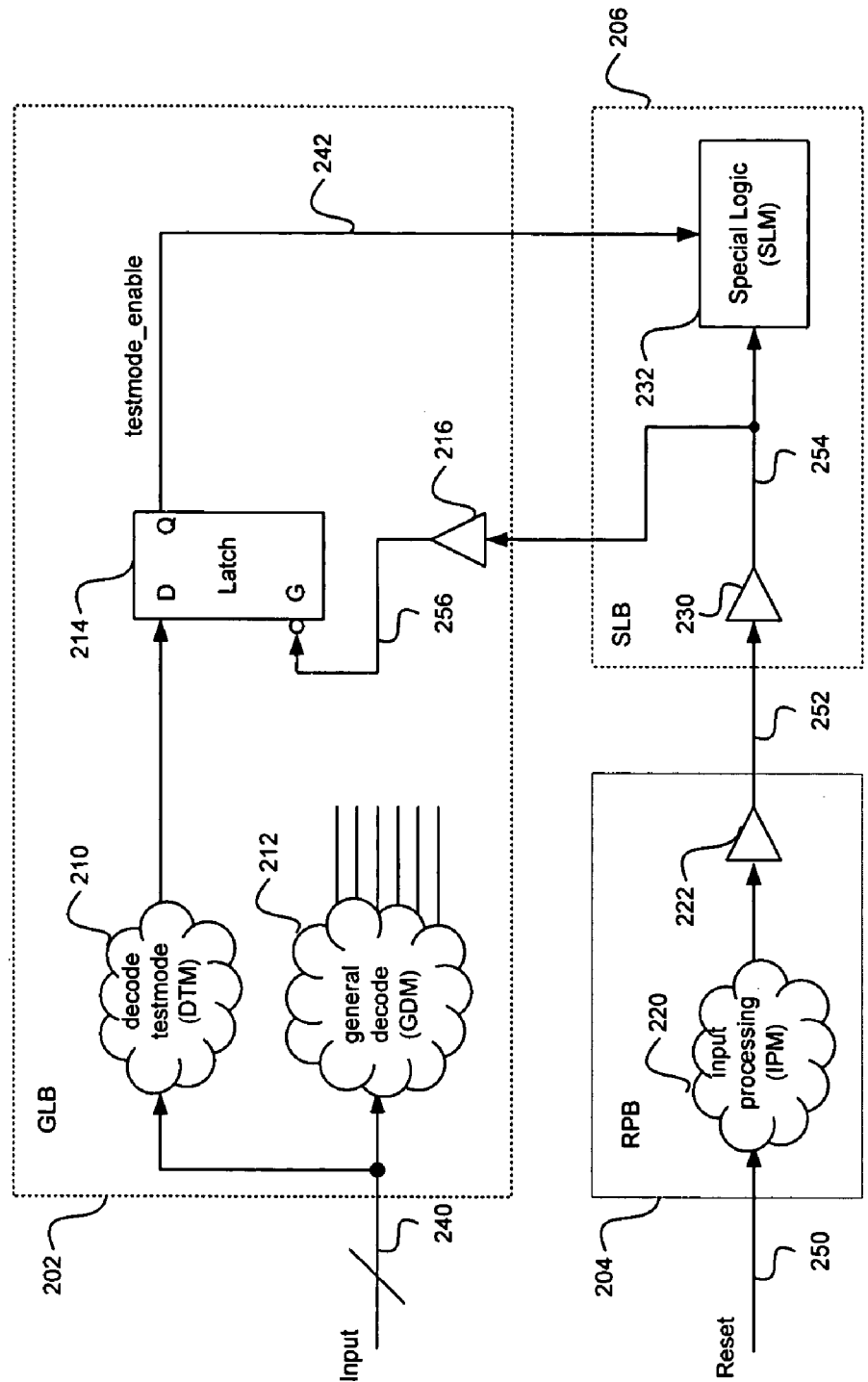
FIG. 2 is a block diagram of an exemplary system for ensuring the assertion order of signals in a chip, independent of layout, in accordance with an embodiment of the invention.

FIG. 2 is a block diagram of an exemplary system for ensuring the assertion order of signals in a chip, independent of layout, in accordance with an embodiment of the invention. Referring to FIG. 2, there is shown a general logic block (GLB) 202, a reset processing block (RPB) 204, and a special logic block (SLB) 206.

The GLB 202 may comprise a decode testmode module (DTM) 210, a general decode module (GDM) 212, a latch 214 and a buffer 216. The DTM 210 may comprise suitable logic, circuitry and/or code that may be adapted to decode input signals, which allows the DTM 210 to generate a test mode signal that may indicate to the chip that a test of the chip may be initiated. The latch 214 may temporarily latch the signal generated by the DTM 210. The GDM 212 may comprise suitable logic, circuitry and/or code such that the chip may function in the manner intended when the chip is in the normal operation mode.

The RPB 204 may comprise an input processing module (IPM) 220 and a buffer 222. The IPM 220 may comprise suitable logic, circuitry and/or code to process an input reset signal 250 for use inside the chip. The SLB 206 may comprise a buffer 230 and a special logic module (SLM) 232. The SLB 206 may be utilized for internally testing the chip, and may also receive a processed reset signal 252. The SLM 232 may comprise suitable logic, circuitry and/or code so that the SLM 232 chip may configure the chip for the chip test. The buffers 216, 222 and 230 may be used to add delay to a signal path.

In the exemplary system of FIG. 2, a plurality of input signals 240 may be coupled to the GLB 202. At least one of the plurality of input signals 240 may be coupled to the DTM 210. An output of the DTM 210 may be coupled to an input of the latch 214, and an output signal testmode_enable 242 of the latch 214 may be coupled to the SLM 232. The input reset signal 250 may be coupled to the RPB 204 and the processed reset signal 252 may be an output of the RPB 204. The processed reset signal 252 may be coupled to the buffer 230 of the SLB 206, and a first reset signal 254 may be the output of the buffer 230. The first reset signal 254 may be coupled to the input of the SLM 232, and also to the input of the buffer 216 in the GLB 202. The output of the buffer 216 may be a second reset signal 256 which may be coupled to an enable input of the latch 214.

The RPB 204 may be adapted to receive and process an input reset signal 250. For example, RPB 204 may be adapted to synchronize the received input reset signal 250 to a system clock in order to generate the processed reset signal 252 for distribution to other blocks. The SLB 206 may receive the processed reset signal 252 from the RPB 204 and may utilize the buffer 230 to generate the first reset signal 254. The first reset signal 254 may be utilized to reset the SLM 232 to a known initial state. The first reset signal 254 may also be communicated to the GLB 202, which may generally be the logic for the normal operating mode of the chip, which may utilize the buffer 216 to generate the second reset signal 256 from the first reset signal 254.

In some exemplary systems, it may be necessary to generate the second reset signal 256 after generating the first reset signal 254. For example, in order for the test mode to operate properly, the SLM 232 may need to be reset prior to rising edge of the testmode_enable signal 242 otherwise the edge sensitive logic inside of SLM 232 may not be in the proper state to detect the rising edge of testmode_enable 242.

Figure 1:
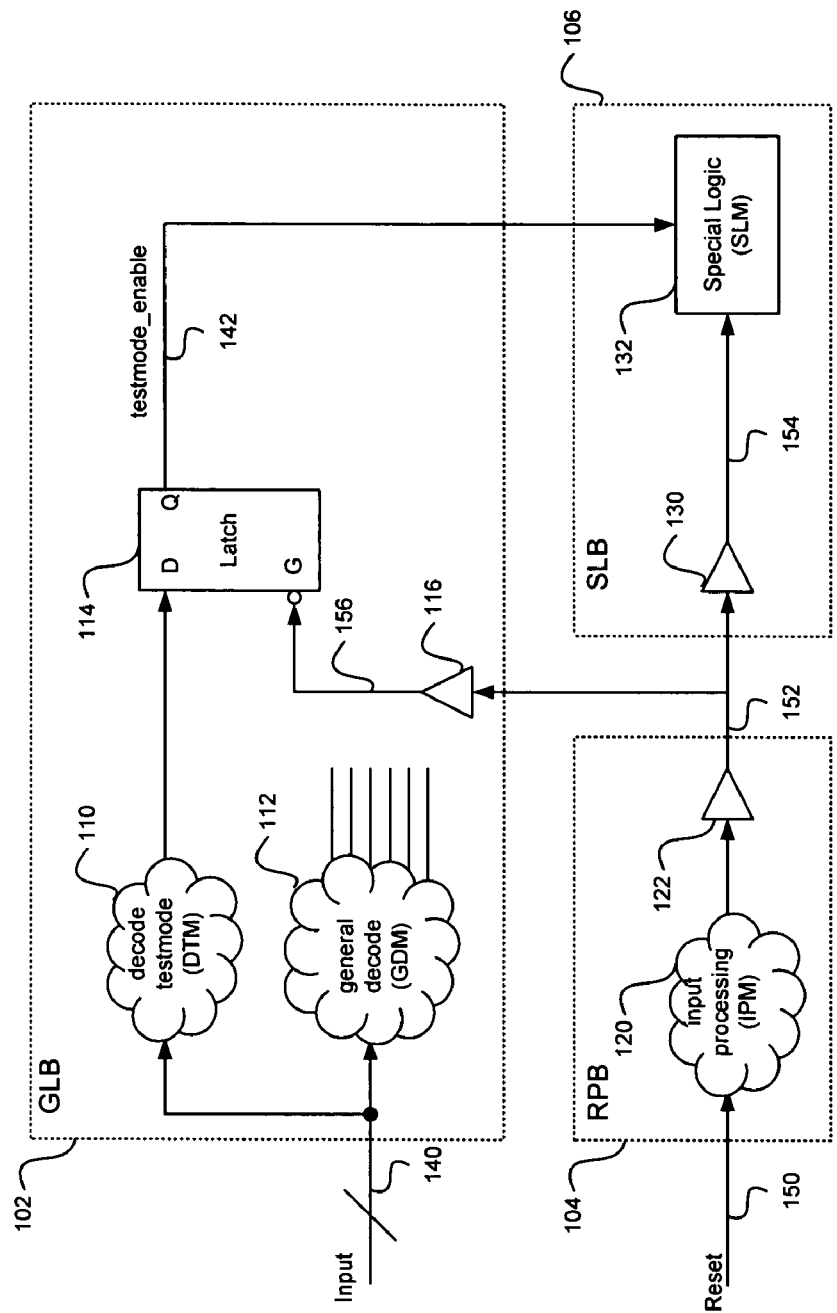
FIG. 1 is a block diagram of a conventional system that illustrates the problems associated with signal propagation in an integrated circuit.

The exemplary system for ensuring the assertion order of signals in FIG. 2 may communicate the first reset signal 254 to the SLM 232 before delivering the second reset signal 256 to the latch 214. The second reset signal 256 may be communicated to the latch 214 after the first reset signal 254 may be communicated to the SLM 232 because of additional delay due to the path connecting the SLB 206 to the GLB 202 and because of the additional delay due to the buffer 216. Since the first reset signal 254 may be communicated to the SLM 232 before the second reset signal 256 may be communicated to the latch 214, the SLM 232 may be reset properly and, therefore, ready to properly utilize the output signal testmode_enable 242 from the latch 214. The proper sequence of generation and utilization of the first reset signal 254 and the second reset signal 256 may allow the chip to be properly tested. In a similar example, the exemplary system in FIG. 1 may not be able to communicate the first reset signal 154 to the SLM 132 before communicating the second reset signal 156 to the latch 114.

Figure 3:
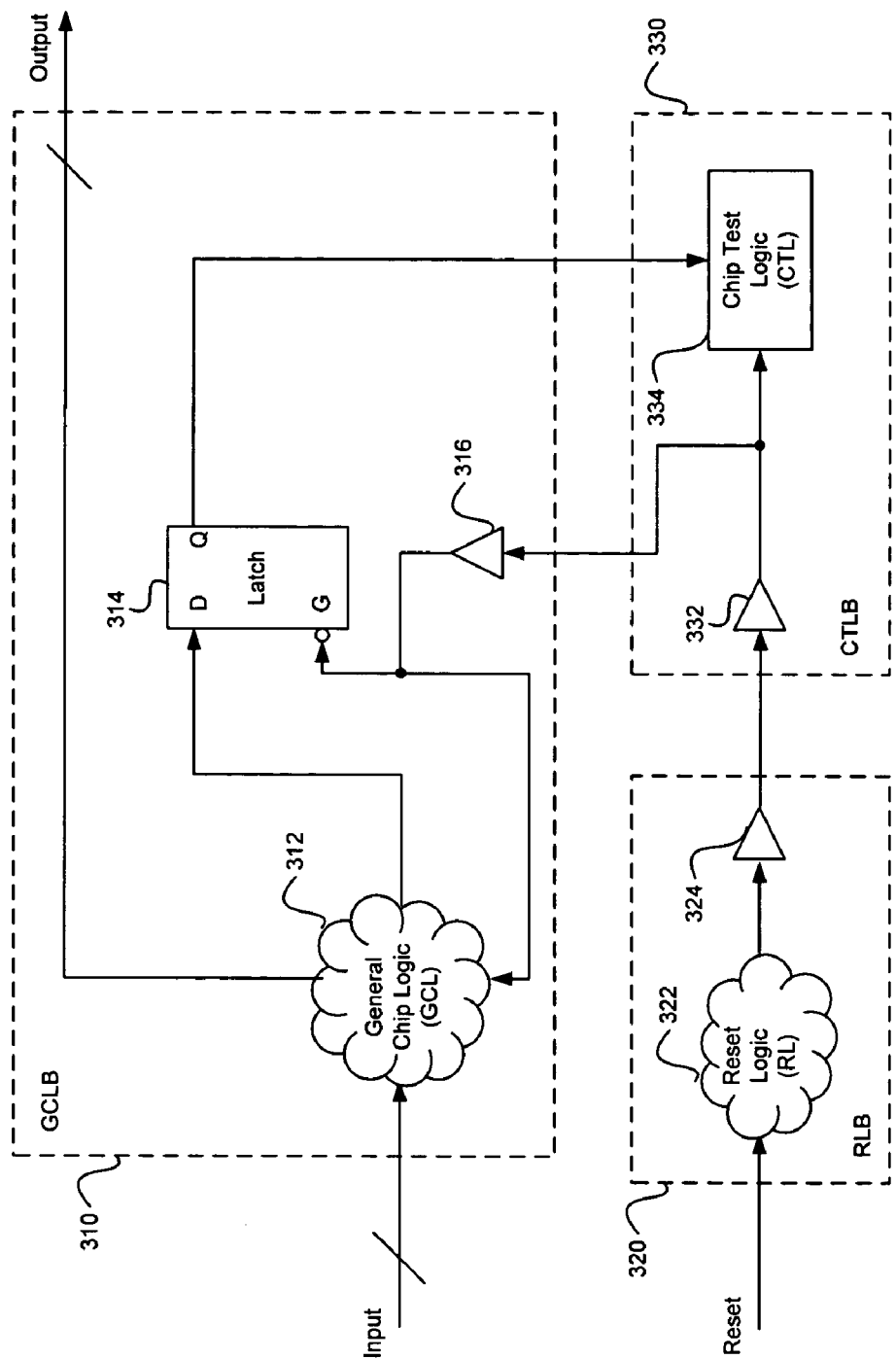
FIG. 3 is a block diagram of an exemplary system for ensuring the assertion of a reset signal at a chip test logic block before the assertion of the reset signal at the general chip logic block that may be used for testing, in accordance with an embodiment of the invention.

FIG. 3 is a block diagram of an exemplary system for ensuring the assertion of a reset signal at a chip test logic block before the assertion of the reset signal at the general chip logic block that may be used for testing, in accordance with an embodiment of the invention. Referring to FIG. 3, there is shown a general chip logic block (GCLB) 310, a reset logic block (RLB) 320, and a chip test logic block (CTLB) 330.

The GCLB 310 may comprise general chip logic (GCL) 312, a latch 314, and a buffer 316. The GCL 312 may comprise suitable logic, circuitry and/or code that may be adapted to decode input signals and which may function in the manner intended when the chip is in the normal operating mode. An output of GCL 312 may be coupled to an input of a latch 314, and an output of the latch 314 may be coupled to an input of the chip test logic (CTL) 334. The latch 314 may be adapted to temporarily latch a signal generated by the GCL 312.

The reset logic block (RLB) 320 may comprise a reset logic (RL) 322 and a buffer 324. The RL 322 may receive an input Reset signal, either generated on the chip or externally to the chip, and the RL 322 may output a reset signal that may be processed. For example, the input Reset signal may be synchronized to a system clock of the chip. The processed reset signal may be buffered by a buffer 324 and the output of the buffer 324 may be communicated to other parts of the chip, for example, to the CTLB 330.

The CTLB 330 may comprise a buffer 332 and the CTL 334. The buffer 332 may be adapted to buffer an output of buffer 324 from the RLB 320. The CTL 334 may comprise suitable logic, circuitry and/or code that may be adapted to perform a chip test when indicated to do so by the output of the latch 314.

In the exemplary system of FIG. 3, a plurality of input signals may be coupled to the GCL 312. An output of the GCL 312 may be coupled to the input of the latch 314, and the output of the latch 314 may be coupled to the CTL 334. The input Reset signal may be coupled to the RL 322 and the output of the RL 322 may be coupled to the input of the buffer 324. The output of the buffer 324 of the RLB 320 may be coupled to the input of the buffer 332 in the CTLB 330. The output of the buffer 332 may be coupled to the input of the CTL 334. The output of the buffer 332 may further be coupled to the buffer 316 in the GCLB 310. The output of the buffer 316 may be coupled to the latch 314 and to the GLC 312. The latch 314 may use the output of the buffer 316 as a latching signal.

A data input to the latch 314, which may indicate that the chip may be tested, may be generated by the GCL 312, and the data input to the latch 314 may be latched by the latching signal from the buffer 316. The output of the latch 314 may indicate to the CTL 334 that the chip may be tested, and the CTL 334 may configure the chip so that it may be tested.

Figure 4:
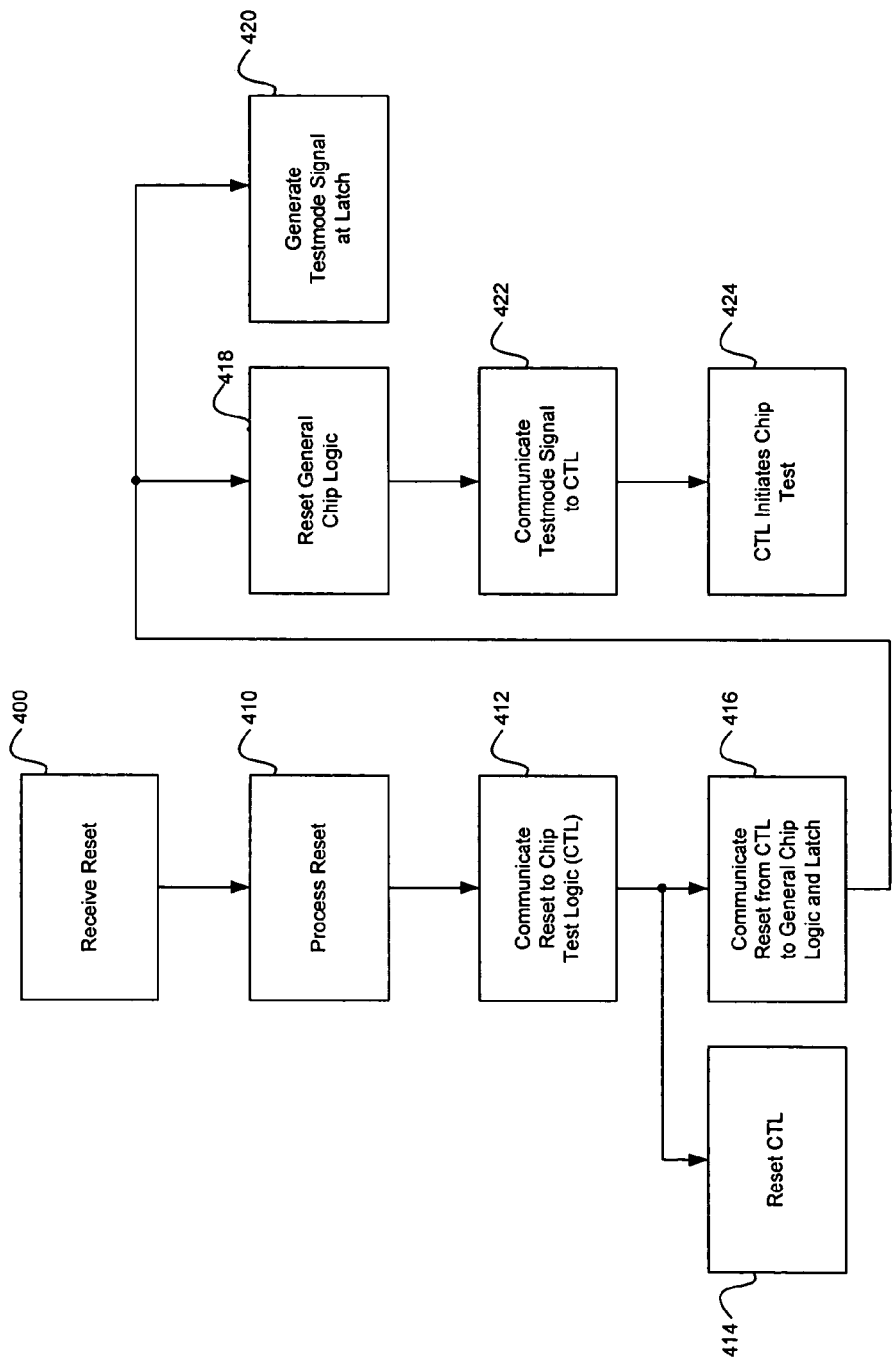
FIG. 4 is a flow chart illustrating exemplary steps for ensuring assertion order of signals in a chip while testing the chip, as illustrated in FIG. 3 in accordance with an embodiment of the invention.

FIG. 4 is a flow chart illustrating exemplary steps for ensuring assertion order of signals in a chip while testing the chip, as illustrated in FIG. 3 in accordance with an embodiment of the invention. Referring to FIG. 4, after the reset signal is received in step 400, the reset signal may be processed, for example, synchronized with a system clock in the chip, in step 410. The processed reset signal from step 410 may then be communicated to the CTLB 330 (FIG. 3) in step 412. In step 414, the processed reset signal may be utilized to reset the CTL 334 (FIG. 3) and, in step 416, may also be communicated to the GCLB 310 (FIG. 3).

The processed reset signal may reset the GLC 312 (FIG. 3) in step 418, and may be adapted to latch a signal from the GLC 312 in step 420. The output of the latch 314, which may indicate that the chip may be placed in test mode, may be communicated to the CTL 334 (FIG. 3) in step 422. Finally, in step 424, the chip may be configured for test mode and then tested.

FIG. 5 is a timing diagram illustrating exemplary timing of signals that may be utilized for ensuring the assertion order of signals in a chip independent of physical layout. Referring to FIG. 5, there is shown a plurality of signals, namely Reset1, Data_input, Reset2, and testmode_enable. The Reset1 signal may be output signal 254 of the buffer 230 (FIG. 2) and may be communicated to an input of the SLM 232 (FIG. 2) so that the logic circuits of the SLM 232 may be reset. The Reset1 signal may also be communicated to the GLB 202 (FIG. 2), where it may be buffered by a buffer 216, and an output of the buffer 216 may be the Reset2 signal. The Reset2 signal may latch a data input to a latch 214 (FIG. 2). The testmode_enable signal (FIG. 2) may be an output of the latch 214 and may be communicated to the SLM 232 (FIG. 2).

The Data_input signal, an output of the DTM 210 (FIG. 2), may reach a stable state 502 while the Reset1 signal level is still high, and provide a stable data input signal to the latch 214. The Reset1 signal level may transition to a low state 504 and resetting of the SLM 232 circuit may be completed. The Reset1 signal may be buffered by the buffer 216 (FIG. 2) and the Reset2 signal may be the output of the buffer 216. The delay through the buffer 216 as well as the propagation delay from the SLB 206 to the GLB 202 may contribute to the transition to a low state 506 by the Reset2 signal after the transition to the low state 504 by the Reset1 signal. The testmode_enable signal may transition to a high state 508 after the Data_input signal may be latched in to the latch 214 by the Reset2 signal. The SLM 232 may accept the testmode_enable signal correctly since the resetting of the SLM 232 circuit may be completed when the testmode_enable signal is generated.

Although the exemplary embodiment of the invention shown in FIG. 2 illustrates the first reset signal 254 and the second reset signal 256 being used internally on the chip, the invention is not so limited. Accordingly, the first reset signal 254 and/or the second reset signal 256 may be communicated to at least one output pin of the chip such that they may be utilized by at least one off-chip device. Furthermore, although the exemplary embodiment of the invention illustrated in FIG. 2 shows a processed reset signal 252 being received by a buffer 230, and a first reset signal 254 being received by a buffer 216, the invention may not be so limited. Accordingly, in an alternative embodiment of the invention, the buffers 216 and 230 may be replaced by combinational or synchronous logic.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for ensuring the assertion order of signals in a chip, comprising:
    receiving a first signal by a first logic block of a plurality of logic blocks integrated within the chip;
    communicating a second signal to a second logic block of said plurality of logic blocks, said second logic block performing a second function, wherein said second signal is a buffered version of said first signal that is generated from within said first logic block, said buffered version of said first signal is used to initiate a reset of a first function; and
    initiating said second function via said second signal, wherein said reset of said first function initializes said first function to a known state prior to said second function generating an output which is to be received by said first function.

2. The method according to claim 1, further comprising initiating a test mode of the chip by said first function after said first function receives said generated output of said second function.

3. The method according to claim 1, further comprising communicating a buffered version of said second signal to an input of a latching device, wherein said latching device is in said second logic block.

4. The method according to claim 3, further comprising latching a data input to said data latching device utilizing said buffered version of said second signal.

5. The method according to claim 1, further comprising communicating said first signal to at least a portion of said plurality of logic blocks in a daisy-chained configuration.

6. The method according to claim 1, further comprising communicating said first signal to at least one output of the chip, wherein said first signal is utilized by at least one off-chip device.

7. The method according to claim 1, further comprising buffering at least a portion of said second signal within said second logic block.

8. The method according to claim 1, further comprising receiving said first signal at said first logic block utilizing synchronous logic.

9. The method according to claim 1, further comprising receiving said second signal at said second logic block utilizing synchronous logic.

10. A system for ensuring the assertion order of signals in a chip, comprising:
    a first logic block of a plurality of logic blocks integrated within the chip that receives a first signal;
    a second logic block of said plurality of logic blocks that performs a second function and that receives a second signal which initiates said second function, wherein said second signal is a buffered version of said first signal that is generated from within said first logic block wherein said buffered version of said first signal is used to initiate a reset of a first function; and wherein said reset of said first function initializes said first function to a known state prior to said second function generating an output which is to be received by said first logic block.

11. The system according to claim 10, wherein said first function commences initiation of a test mode of the chip after said first function receives said generated output.

12. The system according to claim 10, further comprising a latching device in said second logic block, wherein a buffered version of said second signal is communicated to an input of said latching device.

13. The system according to claim 12, further comprising a data input to said latching device, wherein said buffered version of said second signal latches said data input to said latching device.

14. The system according to claim 10, wherein said first signal is communicated to at least a portion of said plurality of logic blocks in a daisy-chained manner.

15. The system according to claim 10, further comprising at least one output on the chip which communicates said first signal to at least one off-chip device.

16. The system according to claim 10, further comprising circuitry that buffers at least a portion of said second signal within said second logic block.

17. The system according to claim 10, further comprising synchronous logic that receives said first signal at said first logic block.

18. The system according to claim 10, further comprising synchronous logic that receives said second signal at said second logic block.

* * * * *